United States Patent [19]
Tsuruoka

[11] Patent Number: 5,296,825
[45] Date of Patent: Mar. 22, 1994

[54] BIAS CIRCUIT HAVING SIGNAL OUTPUT TO DETECTOR PORTION

[75] Inventor: Yoshiyasu Tsuruoka, Kawasaki, Japan

[73] Assignee: Fujitsu Limited, Kawasaki, Japan

[21] Appl. No.: 940,515

[22] Filed: Sep. 4, 1992

[30] Foreign Application Priority Data

Sep. 5, 1991 [JP] Japan .................. 3-224504

[51] Int. Cl.$^5$ .......................... H01P 5/00; H03F 3/19
[52] U.S. Cl. ............................ 333/246; 330/279; 330/297
[58] Field of Search ............... 333/103, 104, 245, 246, 333/262; 330/2, 286, 297, 279, 296

[56] References Cited

U.S. PATENT DOCUMENTS 4,320,353  3/1982  Sasaki .................. 330/286

FOREIGN PATENT DOCUMENTS 125101     7/1984  Japan .................. 333/245
256202    12/1985  Japan .................. 330/286
61-116404  6/1986  Japan .

Primary Examiner—Paul Gensler

[57] ABSTRACT

In a bias circuit including a transmission line and an open stub for preventing a microwave signal from passing through, the lengths of the open stub and a transmission line between the open stub and main transmission line are near $\lambda/4$ but not equal to $\lambda/4$. A leakage signal caused by the above deviations is fed to a detector portion. In the above construction, circuit size of the bias circuit and the detector portion is minimized.

9 Claims, 3 Drawing Sheets

5,296,825

BIAS CIRCUIT HAVING SIGNAL OUTPUT TO DETECTOR PORTION

BACKGROUND OF THE INVENTION

1. Field of the Invention

The present invention relates to a bias circuit for supplying an amplifier of a microwave band, semimillimeter wave band or millimeter wave band, with a bias voltage. More particularly, the present invention is concerned with a bias circuit for supplying the aforesaid amplifier, to which a detector circuit is connected, with a bias voltage.

2. Description of the Related Art

Usually, an amplifier of a microwave band is provided with a diode detector portion at its output side for automatic level control maintaining a level of an output signal at a constant value.

Conventionally, a signal to be input to the diode detector portion is separated from the output signal of the amplifier using a directional coupler. Thus, the directional coupler is required to be provided at output side of the amplifier. A bias circuit is also required to be provided at the output side of the amplifier for supplying the amplifier with a bias voltage.

Therefore, the size of the circuit in the output side of the amplifier is inevitably large. Furthermore, since a part of the output signal is separated in the directional coupler, a level of the output signal is lowered accordingly.

SUMMARY OF THE INVENTION

It is an object of the present invention to provide a bias circuit enabling circuit size in an output side of an amplifier to become small.

It is another object of the present invention to provide a bias circuit improving loss of an output signal of the amplifier.

In accordance with the present invention, there is provided a bias circuit for supplying a main transmission line with a bias voltage and for taking out a detection signal from the main transmission line, the detection signal being for use in detection of a level of a main signal transmitted on the main transmission line, comprising a first transmission line connected to the main transmission line at one end of the first transmission line; a second transmission line opened at one end thereof and connected to the other end of the first transmission line at the other end of the second transmission line; a conductive line connected to the other end of the second transmission line for feeding the bias voltage through the first transmission line to the main transmission line; and a terminal provided between the second transmission line and the conductive line, for taking out the detection signal.

In accordance with the present invention, there is also provided a bias/detector circuit for supplying a main transmission line with a bias voltage and for detecting a level of a main signal transmitted on the main transmission line, comprising: a first transmission line connected to the main transmission line at one end of the first transmission line; a second transmission line opened at one end thereof and connected to the other end of the first transmission line at the other end of the second transmission line; a conductive line connected to the other end of the second transmission line for feeding the bias voltage through the first transmission line to the main transmission line; and a detector portion connected to a point between the second transmission line and the conductive line, for detecting the level of a leakage signal leaked from the main transmission line, to thereby output a detection signal.

DESCRIPTION OF THE PREFERRED EMBODIMENTS

Before describing the preferred embodiments according to the present invention, examples of the related art are given with reference to the accompanying drawings.

Figure 1:
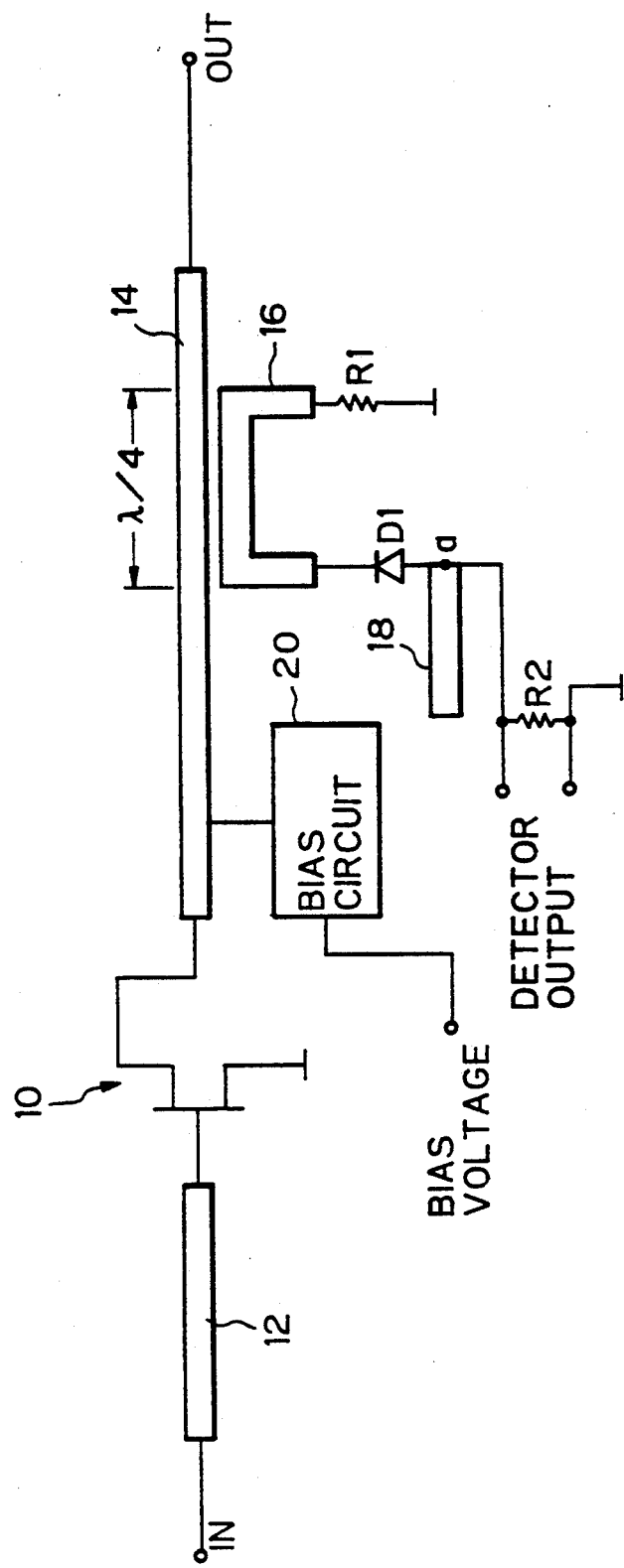
FIG. 1 is a diagram showing a circuit construction of a conventional amplifier of a microwave band.

FIG. 1 shows an example of a conventional amplifier of, for example, a microwave band. In FIG. 1, an FET (Field Effect Transistor) 10 amplifies a signal input through a microstrip transmission line 12 and outputs an amplified signal through a transmission line 14. As a transmission line 16 couples with the transmission line 14 to form a directional coupler, a part of the signal transmitted through the line 14 appears on the line 16. The signal appearing in one end of the line 16 is rectified by a diode $D_1$, and a detection voltage corresponding to a level of the output signal is obtained between both ends of a resistor $R_2$.

A resistor $R_1$ connected between the other end of the line 16 and a ground level provides a return path for a direct current flowing through the diode $D_1$ and provides a nonreflection load for the microwave signal with an impedance equal to a characteristic impedance of the transmission lines. An open stub 18 having a length of $\lambda/4$ provides an imaginary short at a point a to prevent the output signal from passing through, where $\lambda$ is a wave length of the output signal on the transmission line.

From the output energy of the FET 10, for example, about 0.2 dB of the output energy is separated in the directional coupler (14, 16) for use in detection of the output level, and the detection voltage is used for maintaining the level of the output signal at a constant value.

Figure 2:
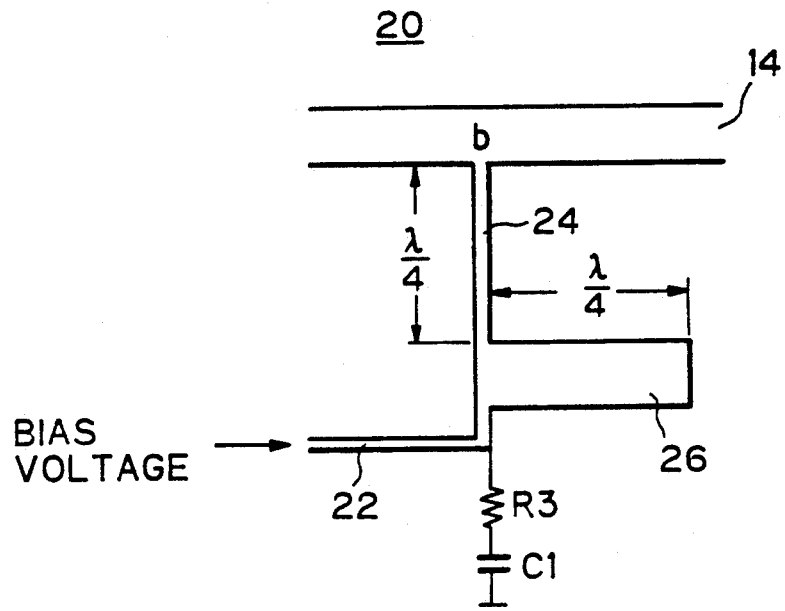
FIG. 2 is a diagram showing a detailed circuit construction of the bias circuit 20 of FIG. 1.

A bias circuit 20 is provided in the line 14 in order to supply a drain terminal of the FET 10 with a bias voltage. FIG. 2 shows a detailed construction of the bias circuit 20. In FIG. 2, the bias voltage is fed through a line 22 and a line 24 to the line 14. An open stub 26 is provided between the lines 22 and 24. Since the length of the line 24 and the stub 26 is $\lambda/4$, an impedance of a circuit below a point b is infinite at the point b, so that the bias circuit below the point b does not affect the signal having a wave length of $\lambda$ transmitted through the line 14. Furthermore, since the width of the line 24 is narrow, i.e., the line 14 has a higher characteristic impedance, and since width of the stub 26 is broad, i.e., the stub 26 has a lower characteristic impedance, a frequency band wherein the impedance of the circuit below the point b is infinite becomes broad. A resistor $R_3$ and a capacitor $C_1$ serially connected between a point between the line 22 and the stub 26 and a ground level provide a nonreflection load for lower frequency signals to prevent the FET 10 from oscillating at a specific lower frequency.

As mentioned previously, the conventional bias circuit requires a large circuit size as shown in FIG. 1 and FIG. 2, and a considerable amount of the output energy of the amplifier is lost in the directional coupler formed by the lines 14 and 16.

The preferred embodiments of the present invention will now be described with reference to the accompanying drawings.

Figure 3:
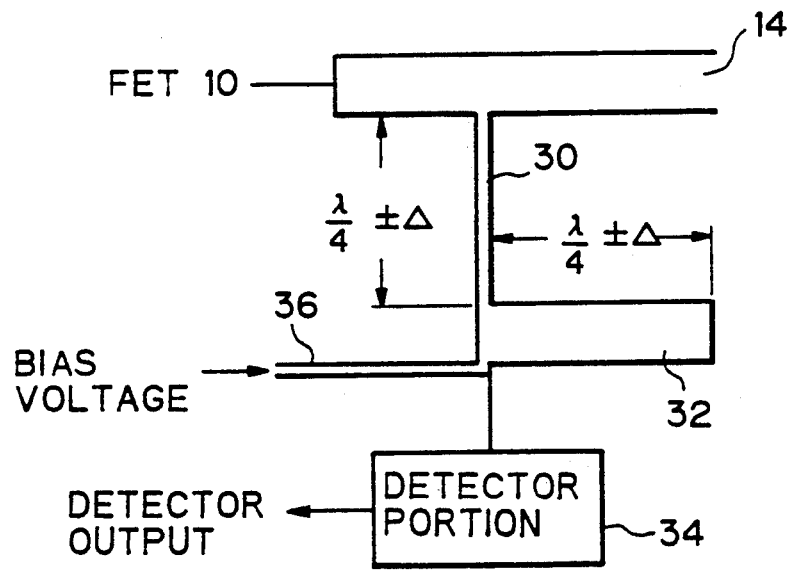
FIG. 3 is a diagram showing a circuit construction of a bias circuit according to an embodiment of the present invention.

FIG. 3 shows a basic construction of a bias circuit according to an embodiment of the present invention. The bias circuit shown in FIG. 3 includes a transmission line 30 having a narrow width, i.e., a higher characteristic impedance, and an open stub 32 having a broad width, i.e., a lower characteristic impedance. One end of the line 30 is connected to the line 14 that is connected to the drain terminal of the FET 10 (FIG. 1). The open stub 32 is connected to the other end of the line 30, and the bias voltage is fed through a line 36 to the other end of the line 30.

According to the present invention, the length of the line 30 and the open stub 32 is $\lambda/4 \pm \Delta$, i.e., near $\lambda/4$ but not equal to $\lambda/4$, and a detector portion 34 is connected to the other end of the line 30. Thus, with regard to the output signal of the amplifier 10 transmitted through the line 14, an impedance of the bias circuit is not completely infinite, and therefore, a small amount of the output signal leaks into the detector portion 34. The leakage signal is detected in the detector portion 34 to provide a detection voltage.

Since the impedance of the bias circuit is not infinite but a certain definite value, impedance matching of the amplifier should be performed for a whole circuit including the bias circuit, by providing matching circuits such as stubs, for example, at an input line and an output line of the transistor.

Figure 4:
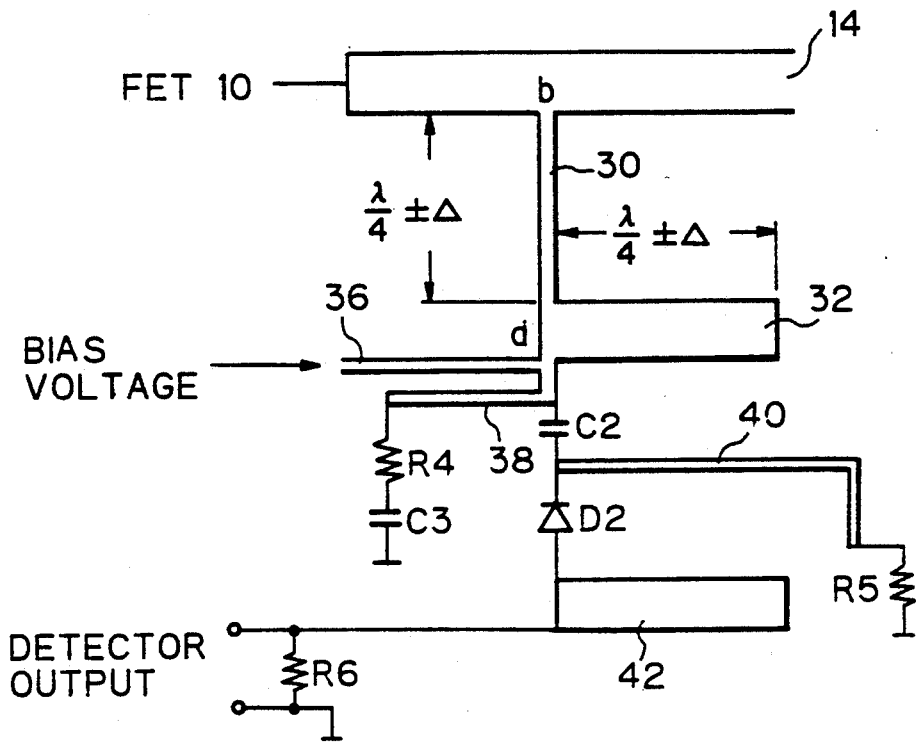
FIG. 4 is a diagram showing a circuit construction of a bias/detector circuit according to another embodiment of the present invention.

FIG. 4 shows a detailed construction of a bias/detector circuit according to another embodiment of the present invention. A bias circuit portion consisting of lines 30, 36 and a stub 32 is the same as that shown in FIG. 3.

As mentioned before, since the length of the line 30 and the stub 32 is slightly shifted from a value $\lambda/4$ by $+\Delta$ or $-\Delta$, a small amount of output energy leaks out at a point d. The line 36 and lines 38 and 40 have higher impedance values as shown in FIG. 4. As capacitance of a capacitor $C_2$ is selected to be low impedance for the output signal as well, the output signal leaking out at the point d is applied through the capacitor $C_2$ to a diode $D_2$ and is detected there. At this time, as a detection current flows through a resistor $R_6$, the diode $D_2$, the line 40, and a resistor $R_5$, a detection voltage corresponding to a level of the output signal appears between both ends of the resistor $R_6$.

An open stub 42 having a length of $\lambda/4$ is provided between the diode $D_2$ and the resistor $R_6$ making an imaginary short to prevent the output signal from passing through. Similar to the resistor $R_3$ and the capacitor $C_1$ of FIG. 2, serially connected resistor $R_4$ and capacitor $C_3$ provide a nonreflection load for lower frequency signals to prevent the FET 10 from oscillating at a specific lower frequency.

Figure 5:
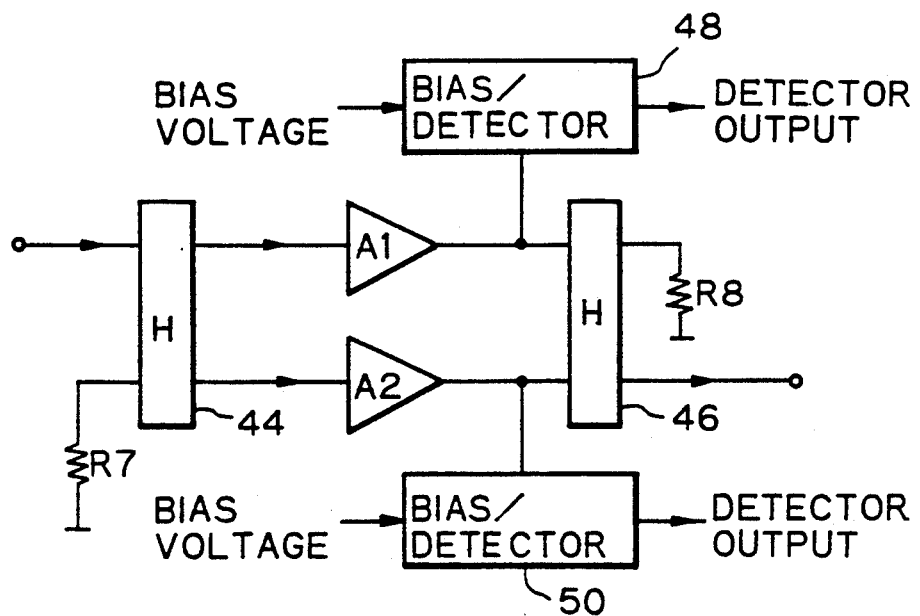
FIG. 5 is a block diagram showing an application of the present invention.

FIG. 5 is a circuit diagram of an amplifier circuit using the bias/detector circuit of FIG. 4 as an example of applications of the present invention. In FIG. 5, two amplifiers $A_1$ and $A_2$ are used to obtain a high output power. An input hybrid 44 distributes an input signal to the amplifiers $A_1$ and $A_2$ and an output hybrid 46 adds signals amplified in the amplifiers $A_1$ and $A_2$. By providing the hybrids 44, 46 at input and output sides, input and output impedance of the amplifier circuit is improved at the same time.

In FIG. 5, bias/detector circuits 48 and 50 are provided at output sides of the amplifiers $A_1$ and $A_2$, respectively. By monitoring detector outputs of the bias/detector circuits 48 and 50, a damaged amplifier is easily identified.

As realized by those skilled in the art, the length value $\lambda/4$ does not only mean that value but means $(\lambda/4) \times n$ where $n = 1, 3, 5 \ldots$

I claim:

1. A bias circuit for supplying a main transmission line with a bias voltage and for taking out a detection signal from the main transmission line, the detection signal being for use in detection of a level of a main signal transmitted on the main transmission line, the circuit comprising:

a first transmission line connected to the main transmission line at one end of the first transmission line;

a second transmission line opened at one end thereof and connected to the other end of the first transmission line at the other end of the second transmission line;

a conductive line connected to said other end of the second transmission line for feeding the bias voltage through the first transmission line to the main transmission line;

a terminal provided between the second transmission line and the conductive line, for taking out the detection signal; and a detector portion connected to said terminal and receiving the detection signal therefrom for detecting a level of a leakage signal leaked from the main transmission line.

2. A bias circuit as claimed in claim 1, wherein the lengths of the first and the second transmission lines are near a value $(\lambda/4) \times n$ and at least one of the lengths is substantially shifted from the value $(\lambda/4) \times n$, where $\lambda$ is a wave length of the main signal and n is an odd integer.

3. A bias circuit as claimed in claim 1, wherein width of the first transmission line is narrower than that of the second transmission line.

4. A bias circuit as claimed in claim 1, further comprising:

a load connected to the terminal, for providing a nonreflection load for signals having frequencies lower than that of the main signal.

5. A bias/detector circuit for supplying a main transmission line with a bias voltage and for detecting a level of a main signal transmitted on the main transmission line, comprising:

a first transmission line connected to the main transmission line at one end of the first transmission line;

a second transmission line opened at one end thereof and connected to the other end of the first transmission line at the other end of the second transmission line;

a conductive line connected to said other end of the second transmission line for feeding the bias voltage through the first transmission line to the main transmission line; and a detector portion connected to a point between the second transmission line and the conductive line, for detecting a level of a leakage signal leaked from the main transmission line, to thereby output a detection signal.

6. A bias/detector circuit as claimed in claim 5, wherein the lengths of the first and the second transmission line are near a value $(\lambda/4) \times n$ and at least one of the lengths is substantially shifted from the value $(\lambda/4) \times n$, where $\lambda$ is a wave length of the main signal and n is an odd integer.

7. A bias/detector circuit as claimed in claim 5, wherein width of the first transmission line is narrower than that of the second transmission line.

8. A bias/detector circuit as claimed in claim 5, further comprising
a load connected to the point, for providing nonreflection load for signals having frequencies lower than that of the main signal.

9. A bias/detector circuit as claimed in claim 5, wherein the detector portion includes
a diode coupled to the point at one end thereof, for rectifying the leakage signal, and
a capacitive element connected to the other end of the diode, for preventing alternate components of the rectified signals from passing through, to thereby generate the detection signal.

* * * * *